United States Patent [19]

Gundlach

[11] 4,014,015
[45] Mar. 22, 1977

[54] ABSOLUTE DIGITAL POSITION MEASUREMENT SYSTEM

[75] Inventor: Philip M. Gundlach, Highland, Ill.

[73] Assignee: Devtron Corporation, Highland, Ill.

[22] Filed: May 5, 1975

[21] Appl. No.: 574,526

[52] U.S. Cl. .......................... 340/347 P; 336/129; 336/130; 340/195; 324/34 PS

[51] Int. Cl.² .......................................... G08C 9/04

[58] Field of Search .... 340/347 M, 347 AD, 347 P, 340/195, 196, 197, 198, 199; 235/154, 150.3; 336/45, 123, 129, 130; 318/562, 563; 324/34 D, 34 P; 73/DIG. 5

[56] References Cited

UNITED STATES PATENTS

| 3,124,795 | 3/1964 | Zardi | 340/347 P |
|---|---|---|---|
| 3,675,235 | 7/1972 | Wayman | 340/347 P |
| 3,819,857 | 6/1974 | Inokuchi | 340/347 AD |

OTHER PUBLICATIONS

Kurbatov "Soviet Journal of Instrumentation and Control," No. 8, Aug. 1969, pp. 22–25.

Primary Examiner—Charles D. Miller
Attorney, Agent, or Firm—Polster and Polster

[57] ABSTRACT

A linear position measurement system including a linear member and a relatively movable member. The linear member includes a plurality of serpentine electrical conductors, each representing one bit of a multiple bit Gray code. At any longitudinal position of the movable member, an inductor in the movable member induces oppositely phased signals in those conductors which lie along a first long edge of the linear member and in those which lie along an opposite edge. A phase comparator in a readout device attached to the conductors compares the signals from each conductor with a reference and constructs a unique address code word indicative of the position of the movable member. The inductor in the movable member is activated through a special circuit which is powered by inductive coupling with a coil carried by the linear member.

31 Claims, 18 Drawing Figures

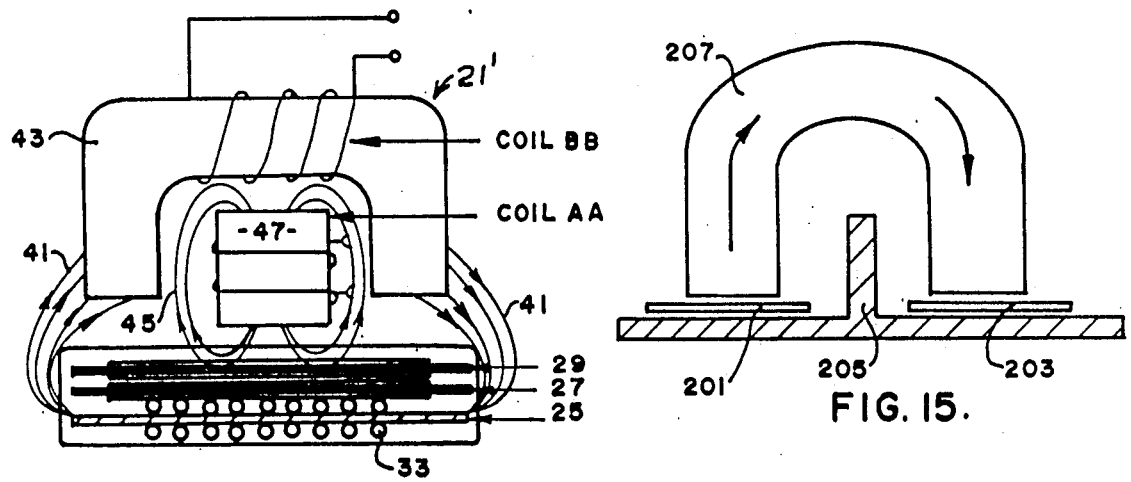
FIG.12.
FIG.15.
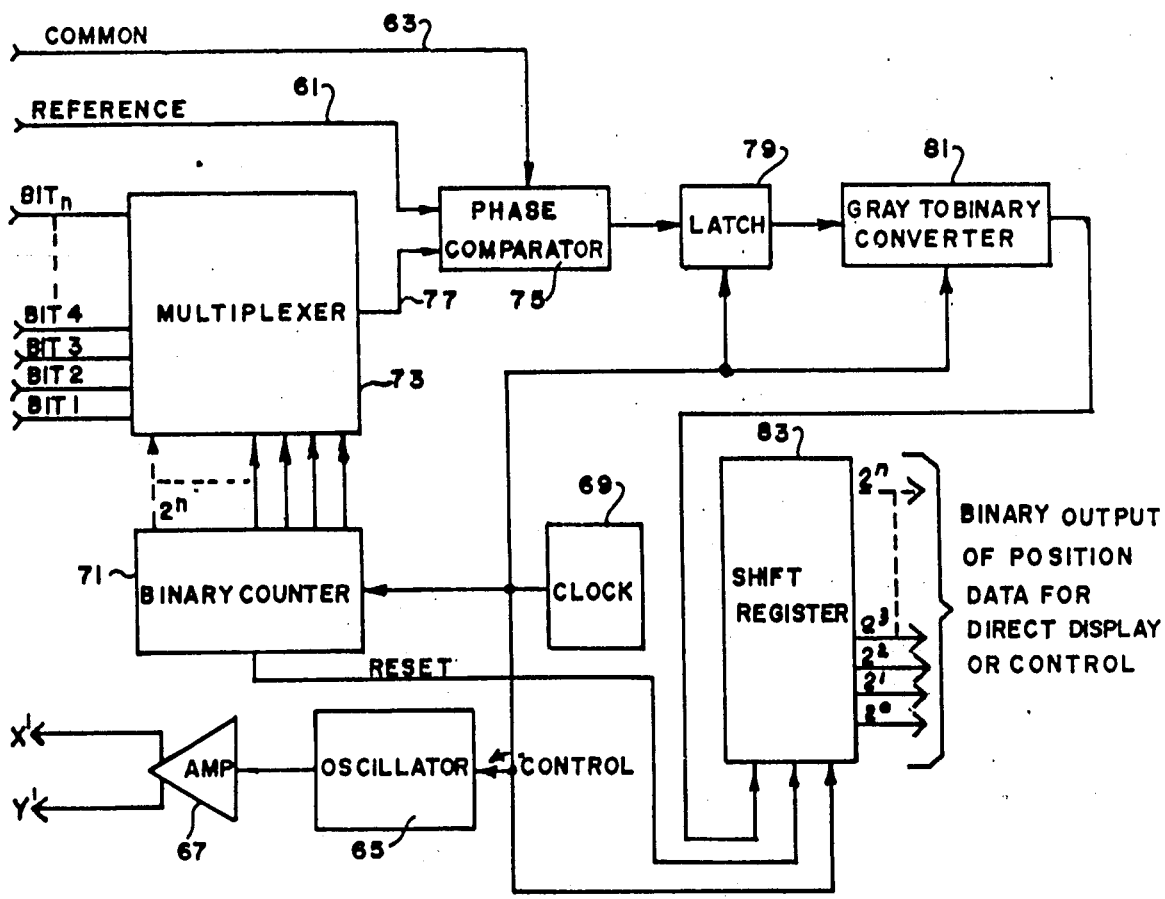
FIG.13.

ABSOLUTE DIGITAL POSITION MEASUREMENT SYSTEM

BACKGROUND OF THE INVENTION

This invention relates to linear position measurement systems, and in particular to a digital absolute position measurement system. Linear position measurement systems include a linear member and a second member which is movable along the length of the linear member. Such systems are widely used, two common applications being in positioning automated machinery and in measuring liquid level.

Numerous position measurement systems are presently used in automated equipment systems. Analog systems of considerable sophistication are known; such a system is set out in Moseley, U.S. Pat. No. 3,075,132 (1963), for example. However, the well-known advantages of digital systems have made them preferred. The known digital systems, some of their present used, and some of their drawbacks are described in Beach et al. U.S. Pat. No. 3,584,284 (1971), and in Waller, U.S. Pat. 3,473,098 (1969). As set out in these patents, a first type of digital measurement system provides an absolute address for each location on the fixed linear member and the movable member reads each address as it passes. A second type provides unlabelled increments along the length of the fixed linear member, the movable member produces an output pulse for each increment it passes, and position is measured in terms of the number of output pulses produced in a given direction relative to a reference point. In both types, the transducer for producing readout signals is frequently an optical transducer consisting of one or more light sources and a corresponding number of photosensitive devices, the optical coupling between which is modulated by the indicia (e.g., reflective or transparent bands) carried by the linear member.

Some incrementing counting systems utilize active conductor portions in both the linear member and a closely spaced slide; the conductor portions are inductively coupled to produce digital increment signals representing traversal of an increment and analog signals representative of position within a particular increment. Such systems have been marketed under the registered trademark Inductosyn and are described, for example, in Tripp et al., U.S. Pat. No. 2,799,835 (1957), and Farrand, U.S. Pat. No. 3,202,948 (1965).

Liquid level measuring devices are known which include a vertically mounted linear member which extends into the liquid and a movable member in the form of a float slidably mounted on the linear member. Neither the optical linear position measuring systems nor the Inductosyn system, however, is very well adapted for use in liquid level measuring devices. The optical transducer is not compatible with immersion in many liquids, nor is the coded linear scale, and both are sensitive to contamination. The difficulties in raising (or lowering) the float to a reference position periodically or after a power outage severely limits the usefulness of any increment counting system. Finally, all of the systems previously described require electrical connections to the movable member (float). The weight and elasticity of the power line must be compensated for as the float rises and falls, and in an Inductosyn system inductive coupling of this line must be minimized.

The linear measurement systems which have been used for liquid level measurement have almost all been analog systems, generally of the variable resistance type. Some of the better systems have used reed switches, activated by a magnet in the float, as shunts to provide a stepped output, as for example in Levins U.S. Pat. No. 3,200,645 (1965). These systems suffer the drawbacks common to analog systems, and the reed switch systems have the further problems and expense of accurately positioning a reed switch for each measurable position of the float's travel. One absolute linear position measurement system used in a liquid level measuring device is disclosed in French Patent No. 1,419,367 (1965) in which a separate float and switch are provided at each discrete position along the linear member and all of the switches are connected in parallel so that each position is indicated by the closing of an individual circuit. Another absolute system, described in Ordorica et al., U.S. Pat. No. 3,154,946 (1964), uses a separate transformer at each discrete position. The transformers are sequentially activated to determine which one is coupled through a magnetic float and therefore produces a higher amplitude output pulse. Such systems are obviously subject to severe practical limitations.

The failure of the prior art to provide an acceptable linear position measurement system for liquid level measurement is attested by the number of indirect level measurement systems which have been proposed and actually used. One widely used system eliminates the linear member, and the position of the float is determined by the length of a cable attached to the float. The cable is played out over a pulley above the liquid, and the excess cable is wound and stored on a drum. The length of cable played out is determined by digital or analog sensing devices associated with the cable, the pulley or the drum. Such a system is shown, for example, in Wright, U.S. Pat. No. 3,069,656 (1962). This type of system has a number of moving parts, requires careful compensation for a number of variables, and is subject to inaccuracies caused by wear of the moving parts, stretching of the cable, and the like. Even less direct systems involve the use of ranging apparatus for reflecting signals off the surface of the liquid, the placing of capacitance probes at intervals along the side of the liquid-containing vessel, the weighing of the entire vessel by means of load cells under the vessel, or determining the vessel's contents by means of pressure transducers at the bottom of the vessel. All of these devices have limited range, have limited accuracy, require careful field installation or compensation for the particular liquid being measured, and are subject to long term drift.

SUMMARY OF THE INVENTION

One of the subjects of this invention is to provide an improved digital linear position measurement system which provides absolute position signals.

Another object is to provide such a system in which no electrical contact need by made between the linear member and the movable member.

Another object is to provide such a system in which no electrical lead need be provided to the movable member.

Another object is to provide such a system which is simple, rugged, compact and inexpensive as compared with presently known systems.

Another object is to provide such a system which is not subject to inaccuracies caused by wear or drift.

Another object is to provide such a system which is readily adaptable to the measurement of liquid levels, including conductive, non-conductive, flammable and corrosive liquids.

Another object is to provide such a system which is highly accurate, even over extended lengths of travel, which provides position information almost instantaneously, and which provides good resolution.

Other objects will become apparent in light of the following description and accompanying drawings.

In accordacne with one aspect of this invention, generally stated, a linear position measurement system is provided which includes a linear member carrying a plurality of conductors arranged in a permutated code. Some or all of the conductors interact with a movable element at each discrete position of the movable element to produce a set of signals which are decoded by a readout device into a digital representation of the position of the movable element. The interaction between the movable element and the conductors is preferably without conductive contact, that is by coupling. Reactive (inductive or capacitive) coupling is preferred where the signals are electrical.

In the preferred embodiment, the permutated code is binary. The conductors are physically constructed and arranged in such a way that at each discrete position of the movable element the element is coupled in a first sense with a unique set of the conductors to produce readable signals in those conductors. In the preferred embodiments, the conductors are serpentine electrical conductors connected to a common ground. A movable member applies an alternating magnetic field to the longitudinal reaches of the conductors at the discrete position adjacent the movable member. Preferably, the movable member carries a coil (inductor). At any longitudinal position of the movable coil, the longitudinal reaches on the same side of the coil as a common reference conductor have induced in them a signal which is in phase with the signal in the reference conductor; the reaches on the opposite side of the coil have an out-of-phase signal induced in them. The conductors are preferably arranged in a unit distance code (Gray code) known as reflected binary code: the first conductor has reaches which are twice the length of each linear position, the second conductor has reaches which are four times the length of each linear position, and so on. This arrangement requires only one conductor to cross over from the "in-phase" side to the "out-of-phase" side, or vice-versa, during the transition between any two discrete positions. In the readout device, each conductor is connected to a phase comparator which reads in-phase and out-of-phase signals as logical zeros and logical ones, thereby producing a code word representative of the position of the movable coil.

The physical construction of the linear measurement system of this invention is greatly simplified by powering the movable coil through an inductive coupling with the linear member. This arrangement eliminates electrical leads to the movable member and makes the system easily adaptable for use as a liquid level gauge. This aspect of the invention is adaptable to other types of position measurement systems. In the preferred system, not only are first signals coupled from the movable member to the cnductors on the linear member, but second signals are inductively coupled from the linear member to the movable member, and means are provided for separating the first signals from the second signals to prevent interference in the readout by the second signals. The separation may be accomplished by mechanical shielding, automatic sequencing, frequency differentiation, and combinations of these techniques.

It will be seen that the position measuring system may be used as a liquid level gauge, simply by encapsulating the movable member as part of a float. When used as a liquid level gauge, the present invention requires no special calibration. The linear member (tape) is secured to the bottom of the container (as by a bracket or a magnet) and pulled taut. The readout device, or a sending unit of the readout device, is attached to the tape an to the top of the container. If measurements in terms of volume rather than depth are required, the digital output signal is easily multiplied by an appropriate conversion factor, or by appropriate conversion factors if the container has other than vertical sides. The digital output is also ideally suited for use in automatic process control equipment.

The physical construction of the linear member also forms a part of the invention. The linear member is in the form of a flexible tape which may be rolled up for shipment and easy installation even in cramped quarters. The tape includes several layers of edge-notched printed circuit or printed wired strips; each strip consists of printed circuit strip modules, having particular conductors thereon, attached end-to-end. The printed circuit strips are laced face-to-face to each other and to an edge-notched steel backing strip carrying a coil which supplies the second signals to power the movable member (float). A protective sheath covers the printed circuit strips and backing strip, isolating them from the liquid and providing a smooth, obstructionless guide for the float.

BRIEF DESCRIPTION OF THE DRAWINGS

In the drawings,

FIG. 12 is a somewhat diagrammatic view showing the physical arrangement of the coils of the movable member of FIG. 6 and their magnetic coupling with the linear member;

FIG. 13 is a block diagram of the circuitry of a readout device connected to the linear member;

FIG. 15 is a diagrammatic view in cross section of yet another embodiment of position measurement system of this invention;

DESCRIPTION OF THE PREFERRED EMBODIMENT

Figure 1:
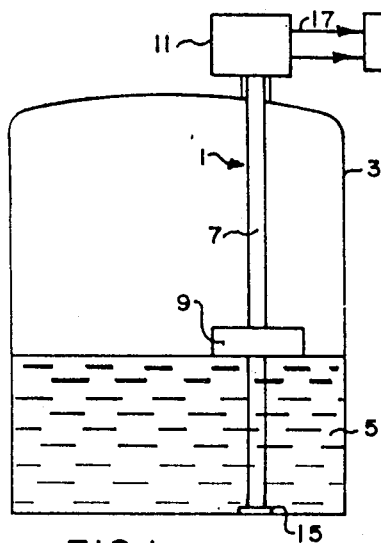
FIG. 1 is a cross-sectional view of a liquid-containing vessel equipped with a liquid level gauge which incorporates a preferred embodiment of position measurement system of this invention.

Referring now to the drawings, FIG. 1 shows the linear position measurement system of this invention used as a liquid level measurement gauge. This illustrative use is one for which the system of this invention is particularly well adapted, as will become apparent. In FIG. 1, reference numeral 1 indicates one illustrative embodiment of liquid level measurement system incorporating the digital absolute position measurement system of this invention. Liquid level gauge 1 is mounted in a vessel 3 containing a liquid 5. The vessel 3 may be a gasoline storage tank, for example, having a height of 50 feet and a diameter of 40 feet.

The digital liquid level measurement system 1 includes a linear measurement member 7, a cooperating float 9, a transmitter unit 11 and a display unit 13.

The linear member 7 is a flexible tape having a cross section of one-and-one-quarter inch by one-quarter inch. The linear member 7 contains a precision measurement element on a steel core which is encased in a jacket or sheath made, for example, from polyvinyl chloride or polytetrafluoroethylene. The linear member 7 is manufactured to the length required for each vessel and is installed by lowering it into the vessel 3 and securing it to the bottom by a mounting bracket, weight or magnet 15. Tape 7 is sufficiently flexible for lengths of from about 20 feet to about 100 feet or more to be shipped in six foot diameter coils without permanently deforming the steel core, and the tapes can be uncoiled while they are being lowered into the vessel 3. The flexibility of the tape 7 also permits it to conform to the side of a vessel having walls which are curved or otherwise non-planar.

The float 9 is designed to float at the surface of the liquid being measured. It can be shaped in a variety of ways to meet applicational requirements and is normally cylindrically shaped with a hollow core. It has typical dimensions of eight inches by two inches high. It may be made, for example, of polyurethane, polyvinyl chloride, polytetrafluoroethylene, or (hollow) stainless steel. A keyhole opening from the periphery of the float 9 to its center and a latch on the float 9 hold it captive around the tape 7. The central opening or hollow core in the float 9 is sized about one-eighth inch larger than the tape in both dimensions, to insure that the float 9 is free to travel up and down the linear member 7 as the liquid level is raised and lowered. The float 9 carries a small, sealed transducer which interacts with the tape 7 to produce a digital measurement signal in the tape 7.

The transmitter unit 11 includes a cast aluminum enclosure with sealed compartments and gasket covers. One compartment provides for termination of the measurement tape and contains an adjustable slide to secure the top end of the measurement tape while allowing up to six inches to pull the member taut in the vessel. Another compartment houses a small electronics module which encodes the signal received from the measurement tape to a tone modulated digital signal. A third compartment houses a terminal block for two wires 17 which provide power to and signals from the transmitter unit 11.

The display unit 13 includes wiring connections for a number of different vessels 3, which may have different sizes and shapes. It also includes a numeric display, function switches for choosing a particular vessel 3, and known circuitry for converting binary signals received over wires 17 from binary to decimal and for suitably buffering the signals for display.

The general mode of operation of the liquid level measuring system 1 is as follows:

The measurement tape assembly includes a steel strip having high magnetic properties. Bonded to this strip is an "excitation" loop consisting of a number of turns of a conductor running the full length of the assembly and terminating in the transmitter 11. This loop is excited with an AC signal (low energy to insure intrinsic safety) and provides a power source for the small transducer in the float regardless of float position. In addition to the excitation loop, a flexible printed circuit is mechanically keyed to the steel core and terminates in the transmitter 11. This printed circuit has a number of conductors arranged in a coded pattern so that each 0.1 inch increment represents a unique code word along the entire length of the measurement tape. The transducer in the float injects a signal into these coded conductors at the point of measurement.

The transmitter unit 11, located at the top end of the measurement tape, receives the signals produced in the conductors and determines the digital code word being generated by monitoring the electrical phase of the signals.

Since a unique conductor pattern exists for each 0.1 inch increment along the measurement tape assembly 7, the system is absolute; that is, the true position of the float is known whenever power is applied to the system. Thus, the system 1 is immune to power outage and electrical disturbances which would cause loss of data in a "pulse counting" system.

The transmitter unit 11 encodes the measurement signal into a two tone serial Gray code signal and impresses this tone signal on the same two wires that supply the low voltage power to the transmitter. This design feature reduces costly field wiring to a minimum.

In a multi-tank installation only one wire run is required for each tank with a common return wire for all tanks; that is, only eleven wires are required for a ten tank installation.

The tone signal from the transmitter consists of a series of high (H) and low (L) tones corresponding to the digital code word representing float position. A transmitter on a tank with 60.0 inches of liquid would transmit the following tone signals to the display unit:

H H L H H H L H L L.

This corresponds to the reflected binary Gray code digital word of:

1 1 0 1 1 1 0 1 0 0 = 600 tenths of inches or 60.0 inches.

The transmission of these tone signals is continuous with a pulse between each "word" to identify the start and finish of each digital transmission.

The display unit 13 receives these tone signals and decodes the reflected binary code word into decimal number to enable the direct display of the liquid level in inches.

The display unit 13 also incorporates a microprocessor which allows internal calculations to be performed to display units of measurement other than inches. The microprocessor may convert depth information to volume information, based on the size and configuration of each vessel 3. For example, for the illustrative cylindrical vessel 3 having a diameter of 40 feet, the display unit may be programmed to multiply the indicated depth in inches by 783.4 to display gallons.

The detailed construction and operation of the liquid level measurement system 1 can best be understood in light of the theory of operation of the preferred embodiment of linear measurement system of this invention and the electronic circuitry utilized in it, with particular reference to FIGS. 2–8.

Figure 2:
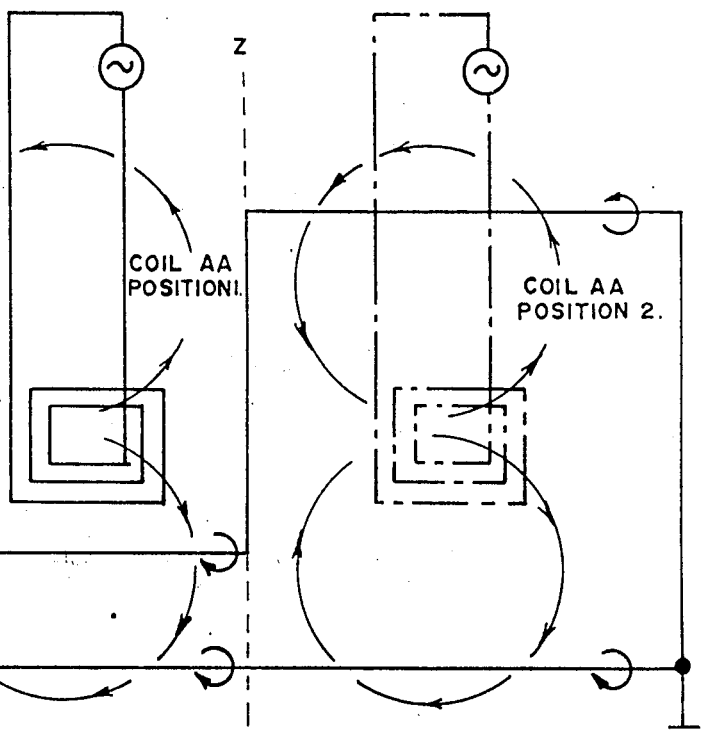
FIG. 2 is a schematic representation of a means for detecting the linear position of a source of alternating magnetic field in accordance with the preferred embodiment of the present invention.
Figure 3A:
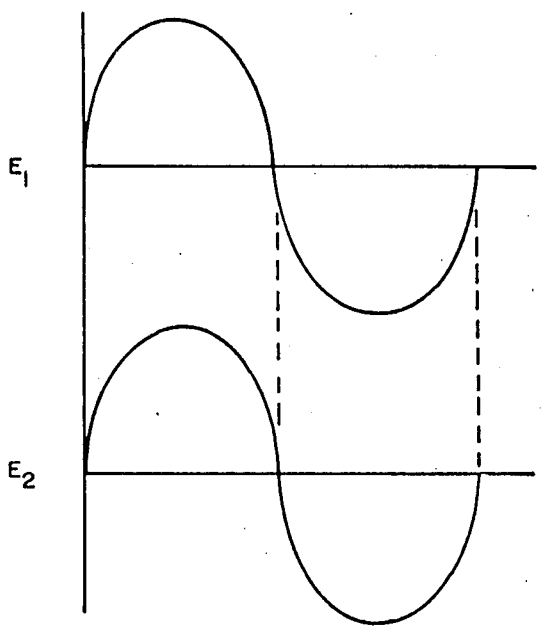
FIG. 3A is a graphical representation of wave forms produced in the conductors A and B of FIG. 2 when the coil AA is in the position shown in solid lines.
Figure 3B:
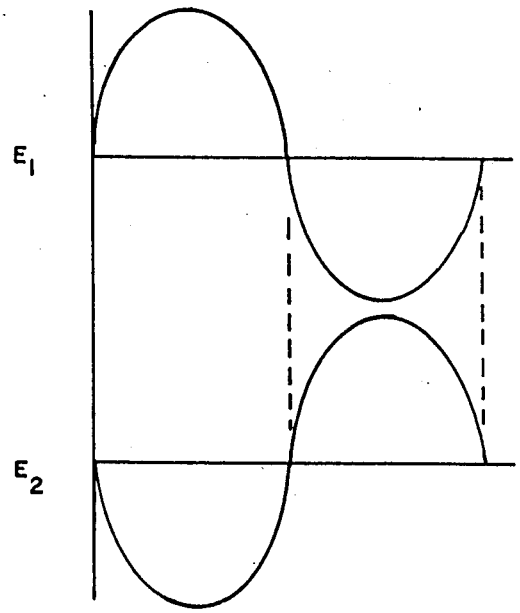
FIG. 3B is a graphical representation of wave forms produced in the conductors A and B of FIG. 2 when the coil AA is in the position shown in broken lines.

FIG. 2 depicts a means of physically arranging two parallel conductors in such a manner as to detect the position of a source of alternating magnetic field. Coil AA is positioned to induce a voltage in conductors A and B. It is readily apparent that when excitation coil AA is in the position shown in solid lines ("position 1") an alternating electrical potential is induced in conductors A and B by inductive coupling (transformer action) and that these electrical potentials represented by $E_1$ and $E_2$ have the same instantaneous polarity and therefore are said to be in phase. However, when excitation coil AA is moved to the position shown in broken lines (position 2), the potential $E_1$ induced in conductor A, will remain the same while conductor B will develop a potential $E_2$ whose instantaneous polarity will be opposite that of conductor A since conductor B is physically displaced from conductor A and positioned so as to couple with lines of magnetic force of opposite direction emanating from coil AA. FIG. 3A shows a plot of voltage against time of potentials $E_1$ and $E_2$ when coil AA is in position 1, and FIG. 3B shows a plot of voltage against time of potentials $E_1$ and $E_2$ when excitation coil AA is in position 2. This forms the basis for a position measurement system, since two discrete positions of the source of alternating electromagnetic field (to the right of line z—z and to the left of line z—z in FIG. 2) can be determined by comparing the phase of the potentials induced in conductors A and B of FIG. 2.

Figure 4:
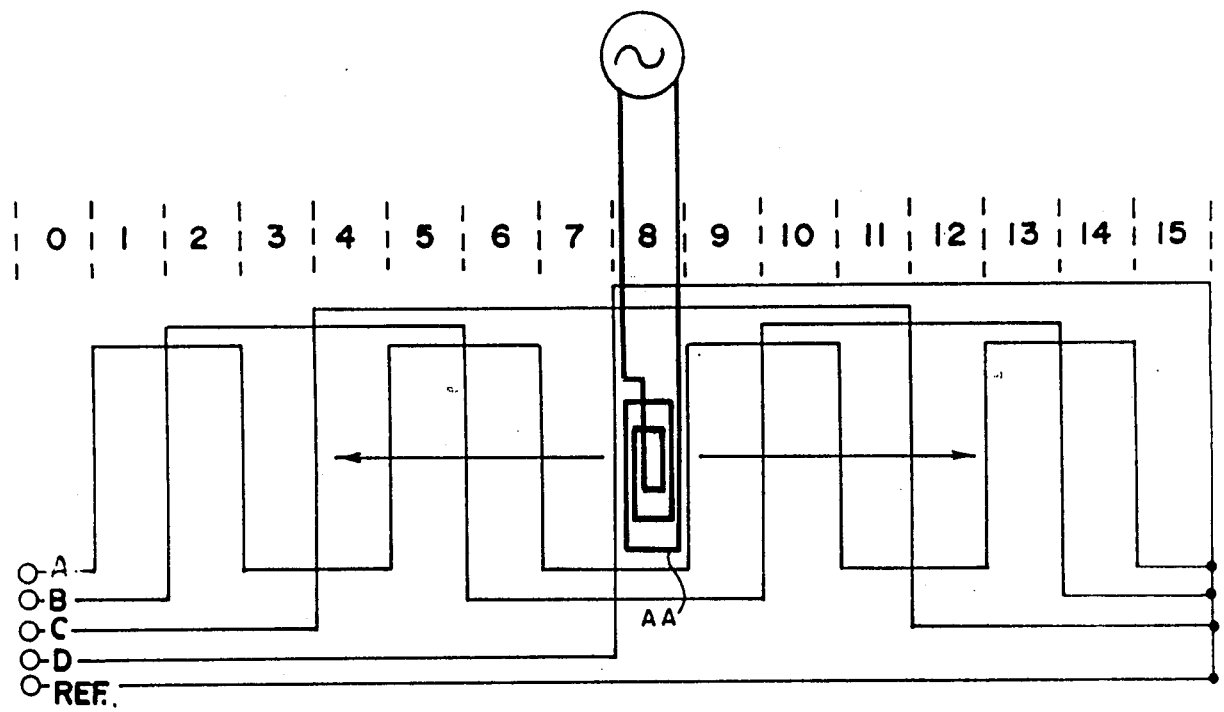
FIG. 4 is a schematic representation of a means for detecting a larger number of discrete positions in accordance with the preferred embodiment of the present invention.

By increasing the number of parallel conductors and arranging them in a permutated code, it is possible to sense more than two positions. FIG. 4 diagrammatically shows four parallel conductors A, B, C and D, each physically placed in a coded pattern. By locating a source of alternating magnetic field (coil AA) at some point along this conductor pattern and observing the phase relationship of the electrical potentials induced in conductors A, B, C and D, the position of this source can be determined. A fifth parallel conductor labeled "REF" (reference) is added, traversing the entire measurement length along one side of the pattern to provide a convenient means for determining the phase relationship of each conductor when exposed to the alternating electromagnetic field from the excitation coil AA. This fifth conductor, or reference, is desirable in applications where it is difficult to use the alternating current source driving coil AA as a reference for phase measurement.

A suitable phase detector can be employed to determine the phase relationship of each parallel conductor with respect to the reference conductor. For the purpose of this description an electrical potential "in phase" with the reference conductor, indicating that the excitation coil AA is at a longitudinal position where the conductor being monitored is adjacent the reference conductor, will be considered a logical "0". Conversely a potential which is "out of phase", because the conductor is displaced from the reference line so as to inductively couple magnetic lines of force of opposite direction emanating from coil AA, will be considered a logical "1".

It will be seen that the conductors A-D in FIG. 4 are arranged in the well-known binary Gray code known as "reflected binary". Table 1 lists the reflected binary code representations and their decimal equivalents for the numbers 0 through 15.

TABLE 1

| Decimal No. | Gray Code |
|---|---|
| 0 | 0 0 0 0 |
| 1 | 0 0 0 1 |
| 2 | 0 0 1 1 |
| 3 | 0 0 1 0 |
| 4 | 0 1 1 0 |
| 5 | 0 1 1 1 |
| 6 | 0 1 0 1 |
| 7 | 0 1 0 0 |
| 8 | 1 1 0 0 |
| 9 | 1 1 0 1 |
| 10 | 1 1 1 1 |
| 11 | 1 1 1 0 |
| 12 | 1 0 1 0 |
| 13 | 1 0 1 1 |
| 14 | 1 0 0 1 |
| 15 | 1 0 0 0 |

At the position of coil AA in FIG. 4, conductors A and B are positioned to develop an electrical potential "in phase" with the reference conductor (logical 0's) and conductors C and D are positioned to develop potentials "out of phase" (logical "1's"). Writing these logical states from right to left and comparing with Table 1, it can be seen that coil AA is at position 8.

| D C B A | POSITION |
|---|---|
| 1 1 0 0 | 8 |

Movement of coil AA along the longitudinal axis parallel to the conductor pattern will cause the signals received at A, B, C, D to exhibit phase relationships which can be decoded as above to produce sixteen recognizable discrete positions.

Although the parallel conductors may be arranged in any of numerous patterns or codes to provide position information signals, the reflected binary code is presently preferred because of its simplicity and because it is one of the most popular unit-distance codes. A Gray code is desirable for use in a measurement system since only one bit changes between representations of two consecutive numbers. Thus, the maximum reading error due to ambiguity when excitation coil AA is located at the transition or boundary between one position and the next can be only one measurement unit. If other codes are used, mechanical or electronic means must be employed to circumvent problems due to ambiguity at transition points.

As more conductors are added to the pattern of parallel conductors, more positions can be defined. For a conductor pattern employing a binary code, the addition of each new conductor doubles the number of recognizable positions. Thus, for $n$ conductors, $2n$ discrete positions can be recognized. For example, a conductor pattern utilizing sixteen parallel conductors will allow sensing 65536 discrete positions.

Figure 5:
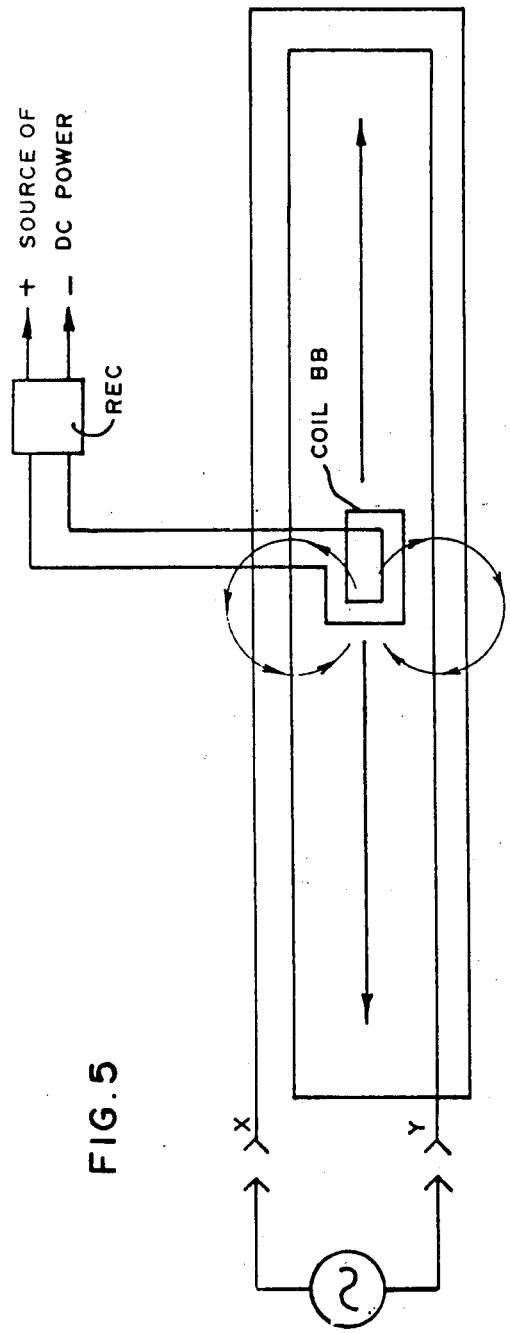
FIG. 5 is a schematic representation of a means for coupling electrical power from a linear member to a movable member in accordance with the preferred embodiment of the present invention.

It is desirable for the signal source driving coil AA to be self-contained and not require physical connection to a power source or require batteries. FIG. 5 depicts a method of deriving this signal source. Conductor X-Y is formed as an elongated excitation coil and serves the function of a transformer primary when it is connected to a source of alternating electrical current. Movable coil BB inductively couples this elongated coil at any longitudinal position of the coil BB to become the transformer secondary. A full-wave rectifier REC connected to the coil BB may form a source of direct current.

The position sensing system of FIG. 4 and the power source of FIG. 5 together form the basis for a linear position measurement device wherein the position of a movable member along the long axis of a linear member can be determined by supplying power to and receiving signals from the linear member only.

Figure 6:
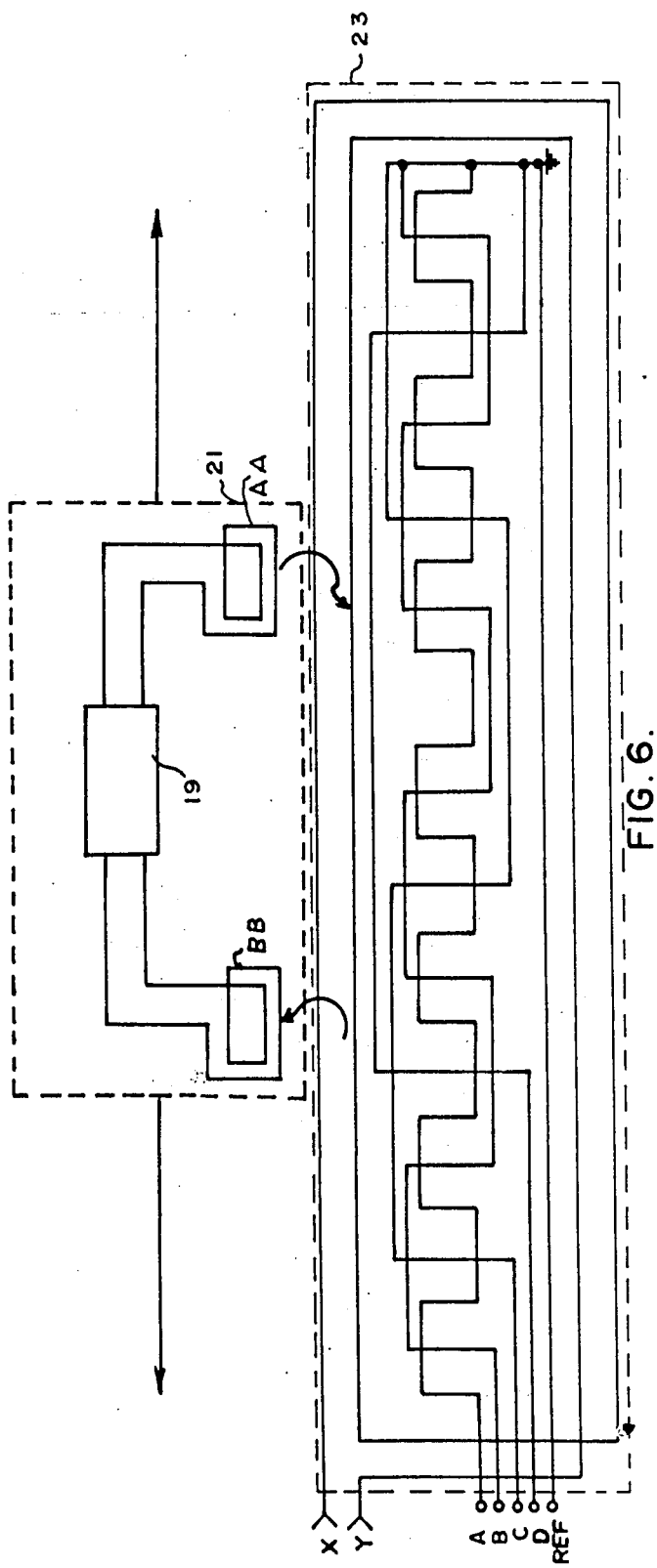
FIG. 6 is a schematic representation of the preferred embodiment of position measurement system of this invention.
Figure 8:
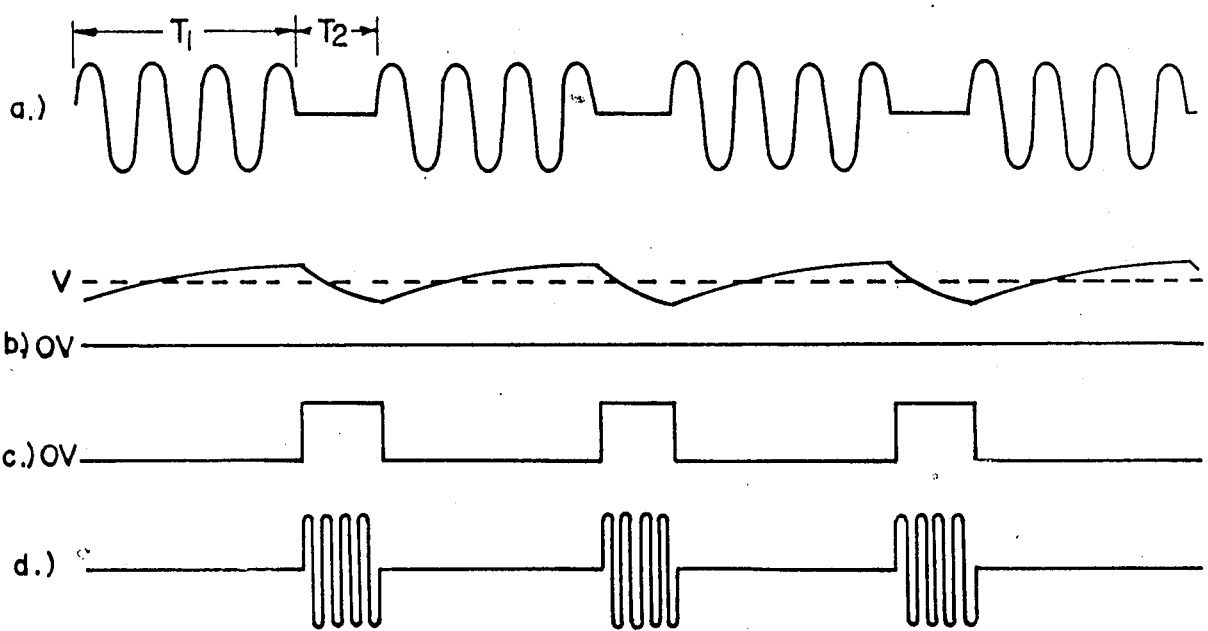
FIG. 8 is a graphical representation of voltages in the circuit of FIG. 7, plotted against time.

FIG. 6 is a composite of the FIG. 4 system and the FIG. 5 system, showing in diagrammatic form the illustrative preferred embodiment of position measurement system of the present invention. As shown in FIG. 6, in the movable member, coil AA is joined by a circuit 19 with coil BB to form a movable transducer 21. Conductors A, B, C, D and REF are mounted on a common flat linear member 23 with the coil X-Y, but are electrically insulated from the coil X-Y. The coded linear member may be termed a measurement assembly. For the sake of clarity, the transducer 21 is shown above one long edge of linear member 23, but it will be understood that in practice the coils AA and BB are located in the geometric center of, and directly over, the face of the flat linear member 23.

Figure 7:
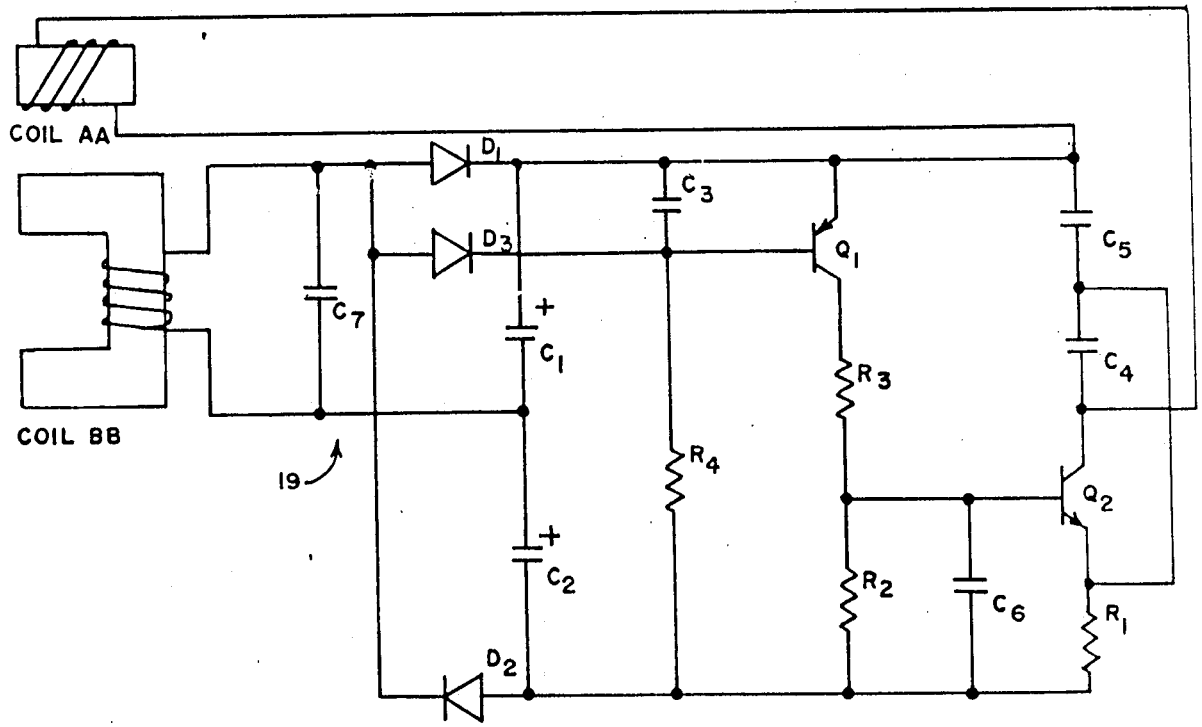
FIG. 7 is a circuit diagram for the movable member of FIG. 6.

The presently preferred form of the transducer circuit 19 is shown in FIG. 7. This circuit automatically activates and deactivates the coil AA in response to bursts of oscillatory signals in the excitation coil X-Y. Coil BB is excited from the excitation loop X-Y in the measurement assembly for a time sufficient to charge the series combination of capacitors $C_1$ and $C_2$ by means of rectifiers $D_1$ and $D_2$ connected in a conventional voltage doubler rectifier circuit. During this charging period rectifier $D_3$ conducts in the same manner as $D_1$ such that the net charge on capacitor $C_3$ is near 0 volts, biasing transistor $Q_1$ "off". When excitation of coil BB ceases, rectifiers $D_1$, $D_2$ and $D_3$ become inactive and capacitor $C_3$ is permitted to charge through the current path provided by resistor $R_4$. When the voltage across capacitor $C_3$ reaches a sufficient level to forward bias the base-emitter junction of transistor $Q_1$, a Colpitts oscillator circuit comprising transistor $Q_2$, resistors $R_1$, $R_2$ and $R_3$ and the tuned circuit consisting of coil AA and capacitors $C_4$ and $C_5$ is activated. Capacitors $C_1$ and $C_2$ then serve as a source of direct current to sustain oscillation. After a suitable time delay determined by circuitry driving the measurement assembly, coil BB is again energized to recharge capacitors $C_1$ and $C_2$ and remove forward bias from transistor $Q_1$. Oscillation then ceases and coil AA become inactive. This process is repeated at regular intervals.

The waveform shown in FIG. 8A depicts the alternating electrical potential developed across coil BB by inductively coupling the excitation loop X-Y in the measurement assembly. $T_1$ represents the time period during which excitation is present and $T_2$ represents the period during which coil BB is de-energized. FIG. 8B graphically depicts the D.C. voltage across the series combination of capacitors $C_1$ and $C_2$. This voltage increases during the time period $T_1$ when energy is being supplied by coil BB and decreases during time $T_2$ while the capacitors are supplying energy for operation of the oscillator circuit. FIG. 8C depicts the voltage at the collector of $Q_1$ and FIG. 8D shows the alternating voltage present at coil AA while the oscillator is energized during time period $T_2$.

One method of construction of the transducer circuit described herein yielded a total package size of 1 in. × 2 in. × 1¼ in., with a weight less than two ounces.

The following component values and operating parameters are listed merely by way of illustration:

| | | |
|---|---|---|
| $R_1$ | = | 330 ohms |
| $R_2$ and $R_3$ | = | 47K ohms |
| $R_4$ | = | 4.7 ohms |
| $C_1$ and $C_2$ | = | 47 mfd |
| $C_3$ | = | .001 mfd |
| $C_4$ | = | .022 mfd |
| $C_5$ and $C_6$ | = | .056 mfd |
| $C_7$ | = | .510 pf |
| $D_1$ and $D_2$ and $D_3$ | = | Silicon diodes |
| $Q_1$ | = | PNP transistor |
| $Q_2$ | = | NPN transistor |
| $f_1$ (frequency of excitation of coil BB) | = | 6 KHZ |
| $f_2$ (frequency of excitation of coil AA) | = | 100 KHZ |
| VDC (voltage across series combination of $C_1$ and $C_2$) | = | 5 VDC |
| $T_1$ | = | 100 ms |
| $T_2$ | = | 15 ms |

It will be seen that the system described with reference to FIGS. 2–8 provides an extremely simple and accurate means for detecting the linear position of a source of alternating magnetic field by using a plurality of parallel conductors arranged in a permutated code, and provides a reliable means for generating this source of magnetic field.

Referring now to FIGS. 9–13, one practical means of fabricating the liquid level measurement system 1 of FIG. 1, to embody the illustrative linear position measurement system of FIGS. 2–8, will be described.

Figure 9:
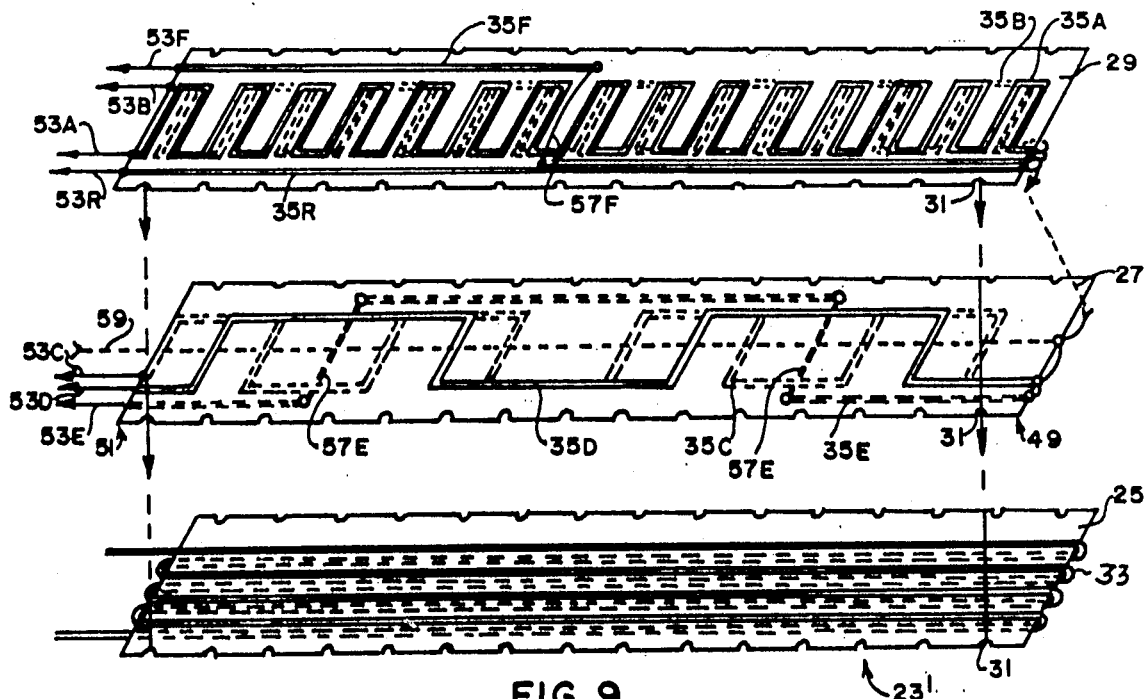
FIG. 9 is an exploded view in perspective of three layers of a tape assembly for use in the linear member of FIG. 6.

FIG. 9 is an expanded view of three elongate members used in the construction of a measurement assembly 23' of the linear member 7 of FIG. 1. The measurement assembly 23' includes a transformer grade steel strip 25, and two strips 27 and 29 of a suitable, flexible electrical insulative material. The strips 25, 27 and 29 are edge notched at accurate intervals as shown at 31. The steel strip 25 provides a mechanically stable base to which members 27 and 29 are secured. The steel strip 25 also serves as a magnetic conductor, or "core", for an excitation loop 33 consisting of a multiple turn conductor wrapped lengthwise around the steel strip 25, so as to produce a magnetic field which is perpendicular to the axis of the steel strip 25 and which emanates from the sides of the steel strip 25, as indicated in FIG. 12.

Figure 10:
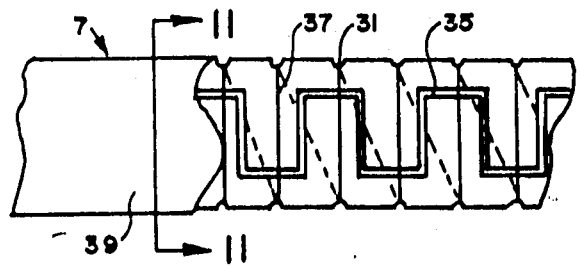
FIG. 10 is a fragmentary view in front elevation, partially broken away, of the linear member of FIG. 6.
Figure 11:
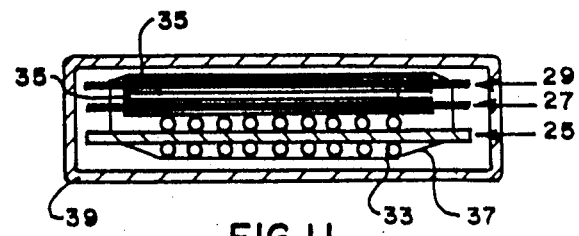
FIG. 11 is a sectional view taken along the line 11—11 of FIG. 10.

Insulative strips 27 and 29 have parallel conductors 35 deposited or etched on both surfaces, as described hereinafter. An insulating film is applied over the exposed conductors and the three strips 25, 27 and 29 are assembled by aligning the notches of all three strips and then "keying" them together by spirally lacing them with a nylon line 37, as shown in FIGS. 10 and 11, to provide a single, flat, tape-like assembly. Aligning the edge notches 31 insures proper registration of the coded conductors while providing dimensional stability to insure measurement accuracy. The measurement assembly 23' is then covered with a protective sheath 39 of polyvinylchloride, to protect the conductors and to provide resistance to mechanical abrasion and isolation from the surrounding environment. It will be seen that the sheath 39 is continuous and of uniform cross-section throughout the length of the linear member 7, to insure smooth and free movement of the float 9 along the linear member 7.

FIG. 12 depicts a cross-sectional view as in FIG. 1 with coils AA and BB of transducer 21' (corresponding exactly to transducer 21) in the float 9 of FIG. 1 positioned above the measurement assembly in their normal operating position. Magnetic field lines have been drawn to graphically depict the interaction of the transducer 21' with the measurement assembly 23'. When excitation loop 33 is energized, the magnetic field 41 emanating from the sides of steel strip 25 couples with the flux collecting core 43 of the coil BB and induces a potential in coil BB. After excitation of the excitation loop 33 ceases, coil AA is energized and radiates magnetic field lines 45, directed by its core 47 to inductively couple with those portions of coded conductors 35 which are in a longitudinal (axial) position closely adjacent the coil AA core 47. The core 47, for example, may limit the effective magnetic field lines 45 to a longitudinal dimension of 0.05 inch. This induction produces the phase coded position signals available to the transmitter 11 at the end of the measurement assembly 23'.

Referring again to FIG. 9, the parallel conductors labeled 35A, 35B, 35C, 35D, 35E and 35F are each arranged in cyclic patterns so as to alternately assume a position either immediately adjacent to a reference conductor 35R or physically displaced to the edge opposite the reference conductor. The position of each conductor is determined by the coded representation of the linear position at that point. For a system utilizing the reflected binary Gray code and having linear measurement increments of 0.1 inch, the cyclic length of each conductor pattern can be determined.

It should be noted that each of these cyclic patterns only becomes repetitive after an initial one-quarter cycle length commencing at the "0" position. The right-hand end 49 of the measurement assembly 23', as viewed in FIG. 9, is the zero point or origin of the linear member, and therefore is the lower end of the linear member 7 of the liquid level measuring system.

The reference conductor 35R is deposited along one edge of the upper face of strip 29.

Conductor 35A, representing place No. 1 (Bit 1) of the code, commences at end 49 of the same upper face of strip 29, and is immediately adjacent and parallel to the reference conductor 35R for one quarter of its 0.4 inch cyclic pattern length or 0.1 inch. It then extends transverse of the longitudinal axis of strip 29 to the edge opposite from reference conductor 35R and continues parallel to the longitudinal axis for a length equal to one-half of its cyclic length, or 0.2 inch. At this point it traverses back again to become closely parallel to reference conductor 35R for the remainder of its cyclic pattern length or 0.2 inch. This cyclic pattern is then repetitive each 0.4 inch traversing the entire length of strip 29 to the other end 51, and terminates at point 53A.

Similarly, conductor 35B (Bit 2) commences at end 49 on the bottom surface of strip 29 and proceeds parallel to and immediately adjacent to reference conductor 35R for one-quarter of its cyclic length or 0.2 inches. It then crosses the longitudinal axis of strip 29 to travel along the opposite edge for one-half of its cyclic length or 0.4 inches. At this point it crosses back again to become closely parallel to reference conductor 35R for the remainder of its cyclic pattern length or 0.4 inches. This pattern then repeats each 0.8 inches traversing the entire length of strip 29 to the end 51 terminating at point 53B.

Conductor 35C (Bit 3) traverses the bottom side of strip 27 in a manner identical with conductors 35A and 35B except with an initial one-quarter cycle length of 0.4 inches, a one-half cycle length of 0.8 inches and a cycle length of 1.6 inches, and terminates at end 51 at point 53C.

Conductor 35D (Bit 4) is on the top surface of strip 27 and has an initial one-quarter cycle length of 0.8 inches, a one-half cycle length of 1.6 inches and a repetitive cycle length of 3.2 inches.

Conductor 35E (Bit 5) traverses the bottom side of strip 27 with an initial length of 1.6 inches and then a repetitive cycle length of 6.4 inches. Jumper wires 57E provide a convenient means of crossing conductor 35C which also occupies the bottom side of strip 27. Conductor 35E is terminated at end 51 at point 53E.

Conductor 35F (Bit 6) traverses the top side of strip 29 running parallel and immediately adjacent to the reference conductor 35R for its one-quarter cycle length of 3.2 inches. At this point jumper 57F crosses the longitudinal axis of strip 29, allowing conductor 35F to continue along the opposite edge to terminate at point 53F. This termination occurs before completion of its one-half cycle length of 6.4 inches since only a short section of the measurement element has been shown here.

Conductors 35A-F and the reference conductor 35R are connected together at origin end 49 by means of suitable jumpers and returned to end 51 by a common conductor 59. This common return 59 is geometrically centered so as to be neutral to the effects of the magnetic field produced by the transducer coil AA and serves as the common or "ground" return for measurement signals developed in the parallel conductors.

The use of two printed circuit boards 27 and 29, rather than other known wiring techniques, is due to cost considerations and ease of expansion to include additional conductors, or bits, required for longer measurement lengths. Additional conductors 35, when required, occupy positions along the edges of strips 27 and 29 and are placed in accordance with their respective cyclic pattern lengths. Jumper wires similar to 57E and 57F of FIG. 9 are used whenever a transition across the center axis of the measurement member is required. Because of the symmetry of the reflected binary code, the length of strips 27 and 29 may be increased by the addition of identical circuit boards butted to the ends of the circuit board strips 27 and 29. The corresponding conductors are connected and the combined strips are held firmly in place when they are laced to the continuous steel strip 25.

FIG. 13 depicts a block diagram of the circuitry of transmitter 11 and display 13 showing one method useful in providing digital position information when coupled to the measurement assembly 23' of linear member 7 and used in conjunction with the transducer 21' of the float 9.

Inputs labeled Bit 1, Bit 2, Bit 3, Bit 4, ... Bit n, are connected to the terminations 53A, 53B, 53C, 53D, ... of the respective coded parallel conductors 35 at the end 51 of the measurement assembly 23'. Thus, the input representing Bit 1 of the Gray Code connects with the coded parallel conductor 35A, and so on.

Input 61 is connected to the reference conductor 35R and input 63 connects to the common return conductor 59. Outputs X' and Y' connect to the excitation loop 33 of the measurement assembly.

In operation, oscillator 65 drives amplifier 67 to produce an alternating electrical potential at X'-Y' sufficient to drive the measurement assembly excitation loop 33. After a suitable delay, a clock circuit 69 deactivates the oscillator 32 by means of the control input and excitation at X'-Y' ceases. The transducer 21', located at some point along the measurement assembly, then becomes active (as described with reference to FIG. 7), and induces an alternating electrical potential in the coded conductors 35 terminating at inputs Bit 1 through Bit n, and in the reference conductor at input 61.

A binary counter 71 addresses multiplexer 73 which functions as a single pole switch so that the potential of one of the n bits is directed to a phase comparator 75 via line 77. The phase comparator determines the electrical phase relationships by comparing the instantaneous polarity of the signal received from the multiplexer with that of the reference input 61. If they have the same phase relationship, the phase comparator output is a logical "0" and latch 79 is set to retain this logical "0". If the instantaneous polarities of the signals received are opposite, then the phase comparator output is a logical "1" and the latch is set to retain this logical "1".

Successive operations of the clock alternately cause the excitation source to be applied to outputs X'-Y' and advance the state of the binary counter 71 addressing the multiplexer 73. In this manner each bit of n bits is sequentially addressed and the latch 79 is set to the logic state represented by the phase polarity of the bit addressed.

Successive operations of the clock also drive a serial Gray to natural binary converter 81 so as to produce a more useful binary output. This binary output is applied to a shift register 83 along with a reset signal from binary counter 71 so as to synchronize the data entry. Thus, the shift register 83 accumulates digital data representative of the relative linear position of the transducer along the measurement assembly.

The binary output available from shift register 83 is constantly updated. With a clock repetition rate of 115 milliseconds, a sixteen place code word representing any of 65,536 discrete positions (up to 546 feet of liquid) is updated approximately every two seconds. The display and control functions of the display 13 may be carried out by means well-known in the art, and do not in themselves form a part of the present invention.

It will be understood that the output of the phase comparator 75 may be tone modulated on lines 17 (FIG. 1) to provide a serial Gray coded signal to a remote display unit 13, the Gray-to-binary converter 81, shift register 83 and display circuitry.

Although the preferred embodiment of digital linear position measuring system of the invention illustrated in its use as a liquid level measuring device, numerous variations in the system and numerous other uses of the system, within the scope of the appended claims, will be apparent to those skilled in the art in light of the foregoing diclosure. A few such variations are described here merely by way of example.

In the preferred system, the signals induced in the coded parallel conductors are isolated from potential interference (noise) caused by the alternating magnetic field of the excitation coil, by sequencing or time sharing the excitation of the coils X'-Y' and AA in a transmit-receive mode. Other techniques can be applied to isolate the phase-coded measurement signals induced in the conductor patterns 35 from spurious coupling with the excitation loop X-Y. For example, in FIG. 6 a source of steady state alternating current can be applied to conductor X-Y so that coil BB is constantly excited at a frequency $f_1$. The output from coil BB is then fed to conversion circuitry and in turn applied to coil AA at a new frequency $f_2$ to induce potentials in the pattern of coded conductors. The coded conductors 35 are then terminated wit frequency sensitive networks responsive only to frequency $f_2$ so that phase comparison can be accomplished without interference from the parallel conductors used as the excitation source for coil BB. This method has merit in applications requiring very high speed of response for readout of measurement data.

Figure 14:
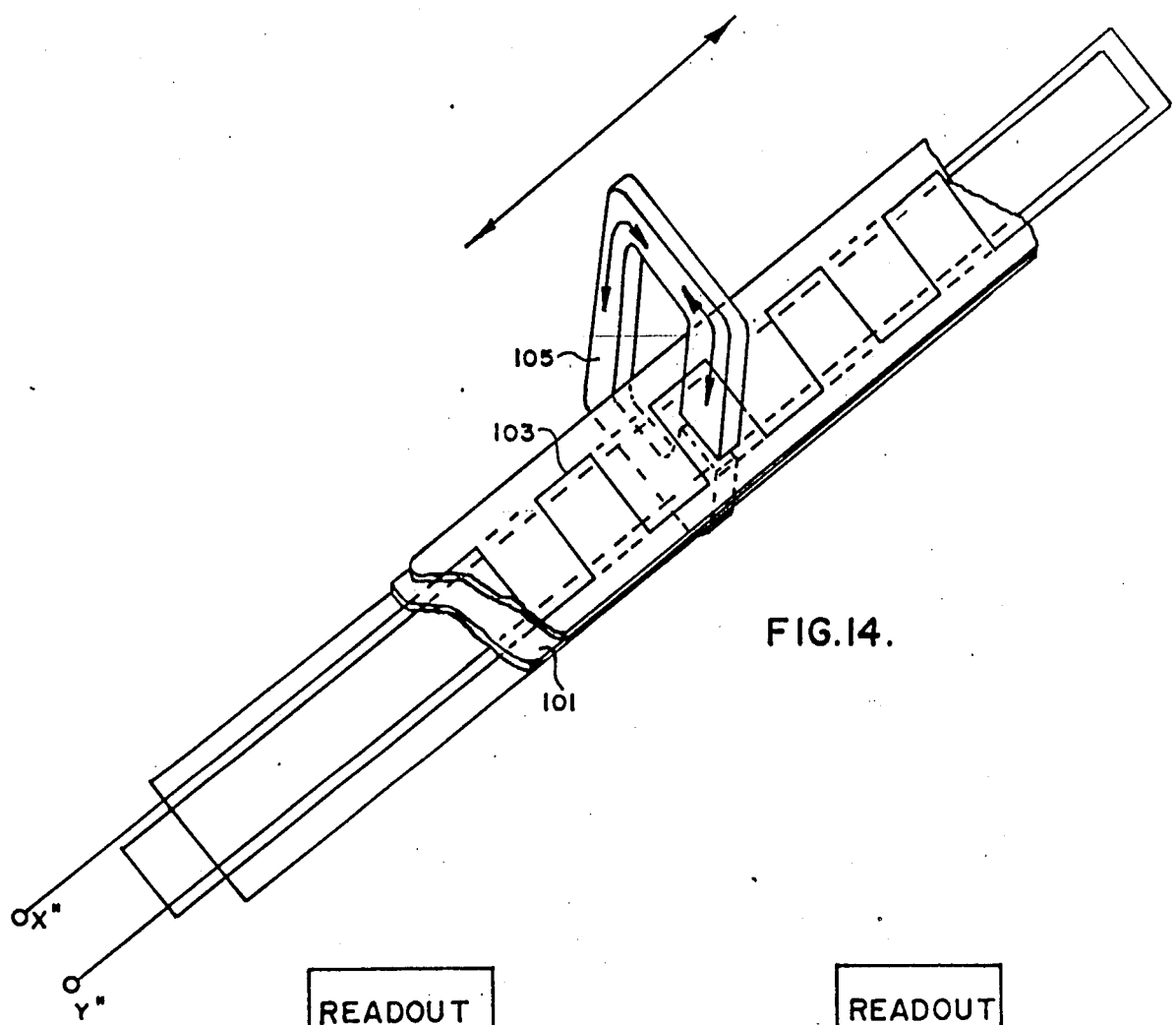
FIG. 14 is a view in perspective, partially broken away, of another embodiment of position measurement system of this invention.

As another example, the conductor X-Y, forming the excitation loop, can be isolated from the coded parallel measurement conductors by shielding and special construction techniques so that the excitation signal from loop X-Y may be reimposed directly on the coded pattern of conductors at the point of measurement. Coil AA and coil BB can be eliminated and a suitable magnetically conductive material used as the transducer to inductively couple the two magnetic circuits at the point of measurement. One such arrangement is shown in FIG. 14 in which an excitation coil X''-Y'' is positioned on the lower face of a magnetically isolating material such as a strip of high mu steel 101, and the coded conductors 103 are positioned above the strip 101, so as to be magnetically isolated from the coil X''-Y''. A longitudinally movable, C-shaped ferrite core 105 provides a magnetic path of high permeability which routes the alternating magnetic potential of coil X''-Y'' to the conductors 103 in a small longitudinal section of the linear member, in the same way as the coil AA in the preferred embodiment. A similar arrangement is shown in FIG. 15 where an excitation coil 201 is parallel to, and in the same plane as, the coded conductors 203, but is separated from them by a T-shaped magnetic shield 205. A U-shaped ferrite core 207 forms an inductive coupling between the alternating magnetic field of the coil 201 and the conductors 203 at the longitudinal position of the core 207. These methods do not require a reference conductor because the source of alternating potential applied to the coded conductors is available and the amount of phase shift produced by the ferrite core is constant. These methods have merit in measurement of position in extremely hostile environments where the presence of active components in the transducer could not be tolerated (e.g. cryogenic applications). A disadvantage lies in the additional expense necessary to provide adequate isolation between excitation and measurement circuits.

The transmitter 11 can be made to handle and transmit all the places (bits) of the permutated code word indicative of position simultaneously, by using a separate phase comparator and latch for each coded conductor. This arrangement eliminates the multiplexer 73 and binary counter 71. To make full use of the additional speed made possible by this approach, separate output lines for each phase (bit) should be provided. This approach also may require more power and may make the device less acceptable in explosive atmospheres.

The arrangement of the coded conductors in a binary code to provide absolute position information is preferred because all signals are a simple yes-no. Only when the transducer is directly centered on a transition is there any ambiguity, and then only as to one unit; in fact, this state may be interpreted as the midpoint between two known positions, and hence can be considered more precise than the usual reading. The reflected binary code also allows a great deal of play in the movement of the transducer relative to the coded conductors of the measurement assembly. It will be noted, however, that analog signals may also be derived from the actual outputs received in the transmitter from the coded conductors or from a separate signal using known analog measurement techniques. An analog signal may be taken, for example, from the relative magnitude of the signal from the conductor changing phase between any two positions as compared with the signal from the reference conductor. Analog signals may also be generated by the use of an Inductosyn type of transformer winding in the transducer, for example, to interact with the Bit 1 conductor.

Figure 16:
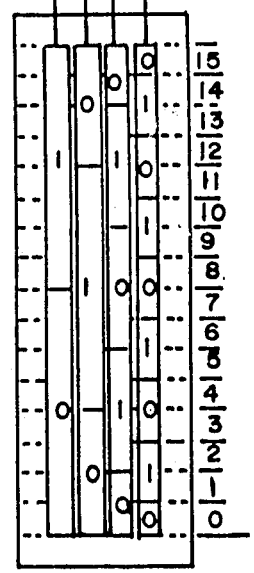
FIG. 16 is a diagrammatic representation of a four-plane binary coded position measurement system of this invention.
Figure 17:
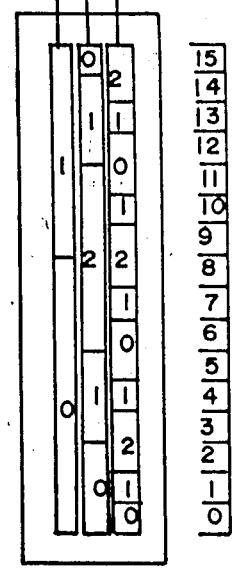
FIG. 17 is a diagrammatic representation of a three-place tertiary (base 3) coded position measurement system of this invention.

The coded conductors may also be arranged in a code having a base other than two. As shown in FIGS. 16 and 17, a sixteen position system requires a four place binary Gray code word and only a three place tertiary (base three) Gray code word; a twenty position system requires five places for a binary system against three for a tertiary. As the number of positions increases, the relative number of conductors needed for a higher base code decreases rapidly. However, the higher the base, the more separate states of the conductors which must be accurately discriminated. Thus, for a system like the preferred embodiment, a third position of the conductors, say along the central axis of the measurement assembly, would require a threshold detector to determine when the conductor is at the central position, thereby greatly increasing the chance of error and greatly reducing the allowable tolerances in constructing the device.

FIGS. 16 and 17, also illustrate one part of the invention in its broader aspects: the arrangement of conductors in a permutated code and their connection to a readout device. Although this arrangement has been illustrated as applied to electrical conductors arranged for inductive coupling with a specially constructed movable member, other types of conductors and other types of couplings are also usable. For these approaches, codes having bases other than two may well be preferred.

Other aspects of the invention such as the method of powering the movable transducer and the construction of the linear member as a flexible tape, are also usable with other types of position measurement systems.

The position measurement system of the invention is readily adaptable to many sorts of automatic equipment control and to other applications in which the position of one element with respect to another must be determined.

These variations are merely illustrative.

Having thus described the invention, what is claimed and desired to be secured by Letters Patent is:

1. In a linear position measurement system comprising a linear member having a length many times as great as its width and an interacting member, the interacting member being movable lengthwise relative to the linear member, the improvement comprising:
   a. permutated code means carried by said linear member for defining absolute positions along its length,
   b. means independent of said interacting member for producing an alternating magnetic field along substantially the entire length of said linear member, and
   c. means carried by said movable member for coupling with said alternating magnetic field to produce signals in said permutated code means so as to produce absolute position information in said linear member representative of the position of said movable member along said linear member.

2. In a linear position measurement system comprising a linear member having a length many times as great as its width, said linear member including at least one serpentine conductive element extending substantially the length of the linear member, an interacting movable member, and readout means electrically connected to said linear member for providing an indication of the position of the movable member along the linear member, the improvement comprising:
   a. inductor means extending substantially the entire length of said linear member,
   b. inductive means for transmitting first electrical signals from said movable member to said serpentine conductive element and for transmitting second electrical signals from said inductor means to said movable member,
   c. signal generating means for generating said second electrical signals in said inductor means, and
   d. means for separating said first signals from said second signals.

3. The improvement of claim 2 wherein said means for separating said first signals from said second signals comprise means for magnetically isolating said serpentine conductive element from the magnetic field of said inductor means.

4. The improvement of claim 3 wherein said means for separating said first signals from said second signals comprise a strip of shielding material separating said inductor means for said serpentine conductive element.

5. The improvement of claim 3 wherein said movable member comprises magnetically conductive means for inductively coupling the inductor means and a portion of the serpentine conductor adjacent the movable member.

6. The improvement of claim 2 wherein said means for separating said first signals from said second signals comprise:
   i. transmit circuit means carried by said movable member for transmitting said first signals to said serpentine conductive element at a first frequency, said transmit circuit means comprising a first oscillator circuit including a first inductor,
   ii. means in said signal generating means for producing said second electrical signals at a frequency different from said first signals, and
   iii. receive circuit means carried by said movable member for receiving said second signals from said inductor means, said receive circuit means comprising a second oscillator circuit including a second inductor.

7. The improvement of claim 2 wherein said means for separating said first signals from said second signals comprise:
   i. transmit circuit means carried by said movable member for transmitting said first signals to said serpentine conductive element,
   ii. means in said signal generating means for propagating discrete bursts of said second signals in said inductor means, and
   iii. receive circuit means carried by said movable member for receiving said second signals from said inductor means, electrical energy storage means for electrically energizing said transmit circuit means, and switch means responsive to said bursts of signals for controlling activation of said transmit circuit means.

8. The improvement of claim 2 wherein said linear member comprises:
   i. a first flat strip of insulative material, said serpentine conductive element lying substantially in the plane of said first strip,
   ii. a second flat strip of magnetically permeable material, said inductor means comprising an electrical coil wound lengthwise around said second strip, said first and second strips being aligned in face-to-face superposition, and (iii) an insulative sheath encasing said first and second strips.

9. In a linear position measurement system comprising a linear member having a length many times as great as its width, a longitudinally movable member coupled with the linear member, and readout means connected to the linear member for indicating the position of the movable member along the linear member, the improvement comprising:
   a. means carried by said movable member for applying first signals in the form of an alternating magnetic field to said linear member in a limited longitudinal portion of said linear member,
   b. a plurality of electrical conductors extending lengthwise of and carried by said linear member, each of said conductors being electrically connected to said readout means, each of said conductors including at least one first longitudinally extending reach and one second longitudinally extending reach, displaced longitudinally from said first reach,
      i. each said first reach being positioned to cause a Phase a signal to be induced in said conductor when said movable member is longitudinally adjacent said first reach,
      ii. each said second reach being positioned to cause a phase B signal to be induced in said conductor when said movable member is longitudinally adjacent said second reach, said Phase B signal not being in phase with said Phase A signal, and
   c. phase comparing means in said readout means for distinguishing between said Phase A and Phase B signals in said conductors.

10. The improvement of claim 9 wherein said readout means comprise means for connecting said phase comparing means with individual said electrical conductors in a predetermined sequence.

11. The improvement of claim 9 wherein $n$ said conductors are provided, each said conductor comprising alternating first and second reaches, said reaches being arranged to form a unique $n$-place binary code word at each of $m$ linear positions along the length of said linear member, the number of linear positions $m$ being at least several times as great as the number of conductors $n$.

12. The improvement of claim 11 wherein said readout means are connected to said $n$ conductors at a first longitudinal end of said linear member, and further including common return line means for completing an electrical circuit through said $n$ conductors, said return line means being connected to said $n$ conductors at the other longitudinal end of said linear member, said return line means being isolated from said first signals applied by said movable member.

13. The improvement of claim 11 wherein said readout means are connected to said $n$ conductors at a first longitudinal end of said linear member, and further including common return line means for completing a circuit through said $n$ conductors, said return line means being connected to said $n$ conductors at the other longitudinal end of said linear member and to said readout means at said first longitudinal end of said linear member.

14. The improvement of claim 11 wherein each of said linear positions is of equal length and wherein said code words are arranged as a reflected binary code,
   i. a first place of said code comprising a first said conductor, said first conductor comprising longitudinal reaches which are twice the length of each said linear position,
   ii. a second place of said code comprising a second said conductor, said second conductor comprising longitudinal reaches which are four times the length of each said linear position,
   iii. a third place of said code comprising a third said conductor, said third conductor comprising longitudinal reaches which are eight times the length of each said linear position;
   iv. a fourth place of said code comprising a fourth said conductor, said fourth conductor comprising at least one longitudinal reach which is sixteen times the length of each said linear position; and
   v. a fifth place of said code comprising a fifth said conductor.

15. The improvement of claim 11 including:
   d. inductor means extending substantially the entire length of said linear member,
   e. means independent of said movable member for applying second electrical signals to said inductor means, said means carried by said movable member for applying first signals to said linear member comprising means for coupling said second electrical signals from said inductor means to said movable member, and f. means for separating said second electrical signals from said first electrical signals.

16. The improvement of claim 15 wherein the frequency of said first electrical signals is different from the frequency of said second electrical signals.

17. The improvement of claim 15 wherein said linear member comprises:
 i. a flat strip of insulative material, at least some of said electrical conductors lying substantially in the plane of said insulative strip,
 ii. a flat strip of magnetically permeable material and an electrical coil wound lengthwise around said magnetically permeable strip, said coil being energizable to produce said second electrical signals, said first and said second strips being aligned in face-to-face superposition.

18. The improvement of claim 17 including a second flat strip of insulative material, at least some others of said electrical conductors lying substantially in the plane of said second insulative strip, said second insulative strip being aligned in face-to-face superposition with said first insulative strip.

19. The improvement of claim 18 including edge notches in each of said first and second insulative strips and in said magnetically permeable strip, and lacing means extending through said notches for aligning said strips and binding said strips together.

20. The improvement of claim 17 wherein said linear member comprises an insulative sheath encasing said first and second strips.

21. The improvement of claim 15 further including:
 g. a reference conductor comprising a single longitudinal reach positioned to cause said Phase A signal to be induced in it at all $m$ linear positions of said movable member, said reference conductor being electrically connected to said readout means and providing a reference for said phase comparing means.

22. The improvement of claim 21 wherein said readout means are connected to said $n$ conductors and said reference conductor at a first longitudinal end of said linear member, and further including common return line means for completing an electrical circuit through said $n$ conductors and reference conductor, said return line means being connected to said $n$ conductors and said reference conductor at the other longitudinal end of said linear member, said return line means being isolated from said first signals applied by said movable member.

23. The improvement of claim 15 wherein said means for separating said first signals from said second signals comprise means for magnetically isolating said conductors from the magnetic field of said inductor means.

24. The improvement of claim 23 wherein said means for separating said first signals from said second signals comprise a strip of shielding material separating said inductor means from said conductors.

25. The improvement of claim 23 wherein said movable member comprises magnetically conductive means for inductively coupling the inductor means and those reaches of the conductors adjacent the movable member.

26. The improvement of claim 15 wherein said means for separating said first signals from said second signals comprise:
 i. transmit circuit means carried by said movable member for transmitting said first signals to said conductors,
 ii. means for propagating discrete bursts of said second signals in said inductor means, and
 iii. receive circuit means carried by said movable member for receiving said second signals from said inductor means, electrical energy storage means for electrically energizing said transmit circuit means, and switch means responsive to said bursts of signals for controlling activation of said transmit circuit means.

27. In a linear position measurement system comprising a linear member having a length many times as great as its width and including at least one conductive element extending substantially the length of the linear member, an interacting movable member, and readout means connected to said conductive element for providing an indication of the position of the movable member along the linear member, the improvement comprising:
 a. means independent of said movable member for producing excitation signals in the form of an alternating magnetic field along substantially the entire length of said linear member, and
 b. means carried by said movable member for coupling said signals at all linear positions of the movable member and for applying localized signals to said conductive element in a limited linear space adjacent said movable member.

28. A linear position measurement system comprising a linear member having a length many times as great as its width; a longitudinally movable element cooperative with the linear member; and readout means for indicating the position of the movable element with respect to the linear member, said linear member being divided into a plurality $m$ of discrete linear positions along its length, said linear member comprising $n$ coded conductors extending lengthwise of the linear member, the number of linear positions $m$ being at least several times as great as the number of conductors $n$, each conductor representing one place of an $n$-place binary code and being operatively connected to said readout means, each conductor comprising along the length of the linear member alternating first longitudinally extending portions cooperating with said movable element to produce in said readout means a signal representative of a logical 1 when said movable element is longitudinally adjacent one of said first portions and second longitudinally extending portions which produce in said readout means a signal representative of a logical 0 when said movable element is longitudinally adjacent one of said second portions, said conductors being so arranged that when said movable member is longitudinally adjacent any one of said $m$ linear positions of said linear member said first and second portions of said conductors at that linear position produce in said readout means a unique code word representative of that linear position.

29. A linear position measurement system comprising a linear member having a length many times as great as its width; a longitudinally movable element cooperative with the linear member; and readout means for indicating the position of the movable element with respect to the linear member, said linear member being divided into a plurality $m$ of discrete linear positions along its length, said linear member comprising $n$ coded conductors extending lengthwise of the linear member, the number of linear positions $m$ being at least several times as great as the number of conductors $n$, each conductor representing one place of an $n$-place binary code and being operatively connected to said readout means, each conductor comprising along the length of the linear member alternating first longitudinally extending portions which couple with said movable element to produce in said readout means a signal representative of a logical 1 when said movable element is longitudinally adjacent one of said first portions and second longitudinally extending portions which couple with said movable element to produce in said readout means a signal representative of a logical 0 when said movable element is longitudinally adjacent one of said second portions, said first and second portions of said conductors being arranged to form a unique binary code word at each of said $m$ linear positions along the length of said linear member.

30. A linear position measurement system comprising a linear member having a length many times as great as its width; a longitudinally movable element cooperative with the linear member; and readout means for indicating the position of the movable element with respect to the linear member, said linear member being divided into a plurality $m$ of discrete linear positions along its length, said linear member comprising: $n$ coded conductors extending lengthwise of the linear member, each conductor representing one place of an n-place permutated digital code of base $b$, $n$ being greater than $b$ and $m$ being at least several times greater than $n$, each conductor being operatively connected to said readout means, each conductor comprising a plurality of conductively joined longitudinally extending portions, each said longitudinally extending portion being constructed and arranged to couple with said movable element when said movable element is longitudinally adjacent said portion to produce in said readout means signals representative of one of the $b$ digits of said code; said portions being so arranged that when said movable member is longitudinally adjacent any one of said $m$ linear positions of said linear member said portions of said conductors produce in said readout means a unique code word representative of that linear position.

31. A linear position measurement system comprising a linear member having a length many times as great as its width, said linear member being divided into a plurality $m$ of discrete linear positions along its length; a longitudinally movable element cooperative with the linear member; readout means for indicating the position of the movable element with respect to the linear member, means for producing an alternating magnetic field along substantially the entire length of said linear member, and $n$ coded conductors carried by the linear member, the number of linear positions $m$ being at least several times as great as the number of conductors $n$, each conductor representing one place of an $n$-place permutated digital code and being operatively connected to said readout means, said movable element, at all $m$ linear positions of said linear member, inductively coupling said alternating magnetic field and applying to said coded conductors signals which are read as a code word by said readout means, said conductors being so constructed and arranged that said movable element produces in said readout means a unique digital code word for each of said $m$ positions.

* * * * *

UNITED STATES PATENT AND TRADEMARK OFFICE
CERTIFICATE OF CORRECTION

PATENT NO. : 4,014,015
DATED      : March 22, 1977
INVENTOR(S): Philip M. Gundlach It is certified that error appears in the above-identified patent and that said Letters Patent are hereby corrected as shown below:

Col. 1, line 20, "present used" should be "present uses".

Col. 1, line 40, "Some incrementing" should be "Some increment".

Col. 2, line 57, "One of the subjects" should be "One of the objects".

Col. 3, line 66, "cnductors" should be "conductors".

Col. 4, line 14, "tape an to" should be "tape and to".

Col. 5, line 21, "plane binary" should be "place binary".

Col. 14, line 37, "wit" should be "with".

Col. 17, line 66, "Phase a" should be "Phase A".

Signed and Sealed this fifth Day of July 1977

[SEAL]

Attest:

RUTH C. MASON
Attesting Officer

C. MARSHALL DANN
Commissioner of Patents and Trademarks